INVENTOR.
BRIAN DALE
BY David M. Keay
AGENT.

June 17, 1969 B. DALE 3,450,959

FOUR-LAYER SEMICONDUCTOR SWITCHING DEVICES IN INTEGRATED CIRCUITRY

Filed July 6, 1965

INVENTOR.
BRIAN DALE

BY David M. Keay
AGENT.

June 17, 1969 B. DALE 3,450,959
FOUR-LAYER SEMICONDUCTOR SWITCHING DEVICES IN INTEGRATED CIRCUITRY
Filed July 6, 1965

INVENTOR.
BRIAN DALE
BY
David M. Keay
AGENT.

United States Patent Office 3,450,959
Patented June 17, 1969

3,450,959

FOUR-LAYER SEMICONDUCTOR SWITCHING DEVICES IN INTEGRATED CIRCUITRY

Brian Dale, West Peabody, Mass., assignor to Sylvania Electric Products Inc., a corporation of Delaware Filed July 6, 1965, Ser. No. 469,567
Int. Cl. H01l 15/00, 11/60
U.S. Cl. 317—235 1 Claim

ABSTRACT OF THE DISCLOSURE

Silicon wafer containing several individually electrically isolated four-layer switching devices. Each device comprises four zones of silicon of alternating conductivity type. Each zone of a device is surrounded by the succeeding zone, and each zone has a surface area at the upper surface of the wafer to which electrical contact can be made. The outermost zone of each device forms a PN junction with the silicon of the wafer thus providing for electrical isolation of each device.

Figure 1:
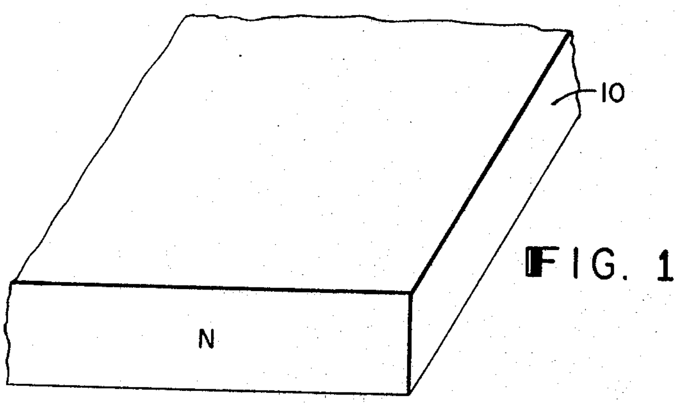

This invention relates to semiconductor electrical translating devices. More particularly, it is concerned with semiconductor switching devices of the type known as PNPN or four-layer devices incorporated in monolithic integrated circuit networks.

Semiconductor devices having four successive layers, or zones, of semiconductor material of alternating conductivity types providing a three-junction device are well known. These devices, commonly referred to as PNPN switches, have a voltage-current characteristic which includes a negative resistance region intermediate high impedance and low impedance positive resistance regions. This characteristic permits their use in a variety of switching applications.

PNPN switches which may be triggered from the high impedance-low conduction, or "off," condition to the low impedance-high conduction, or "on," condition in addition to the cathode and anode connections at the terminal zones have a gate connection at one of the intermediate zones to which triggering pulses are applied. Certain types of PNPN switches may also be triggered from the on condition to the off condition by appropriate triggering pulses applied to the gate.

Although PNPN switching devices in the form of individual components have been widely used, there have been problems in incorporating these devices in monolithic integrated circuit networks. In order for a device to have the desired electrical characteristics each of the four active zones must be of appropriate electrical resistivity and physical configuration. In addition, the four active zones must be located within the bulk of a semiconductor body in such a way that the four zones coact with each other to achieve the proper switching action while being electrically isolated from other active devices within the same body of semiconductor material. It is also necessary that certain of the active zones of the device be accessible so that electrical connections can be made to them. It has proven extremely difficult to produce monolithic integrated circuit networks having four-layer devices which satisfy these requirements by employing techniques previously used in fabricating individual PNPN components.

It is an object of the present invention, therefore, to provide an improved semiconductor switching device suitable for use in monolithic integrated circuits.

It is another object of the invention to provide a monolithic integrated semiconductor circuit network including PNPN switching devices having satisfactory electrical characteristics and satisfactory isolation between devices.

It is also an object of the invention to provide an improved method for producing monolithic integrated circuit networks having four-layer semiconductor switching devices.

Briefly, a monolithic integrated circuit network of the invention comprises a body of semiconductor material which has four-layer devices spaced apart by portions of the bulk region of the semiconductor body of one conductivity type. Each device includes four zones of the body of alternating conductivity type. The first zone is of the one conductivity type and has a surface area in a surface of the body. The second zone is of the opposite conductivity type, lies intermediate the first zone and the third zone, and has a surface area in the surface of the body which encircles the surface area of the first zone. The third zone is of the one conductivity type, lies intermediate the second zone and the fourth zone, and has a surface area in the surface of the body which encircles the surface area of the second zone. The fourth zone of the body is of the opposite conductivity type, lies intermediate the fourth zone and the bulk region of the body, and has a surface area in the surface of the body which encircles the surface area of the third zone. The bulk region of the body is contiguous the fourth zone and has a surface area in the surface of the body encircling the surface area of the fourth zone.

A monolithic integrated circuit network incorporating four-layer devices which fulfill the foregoing description is fabricated by employing a starting substrate of semiconductor material of the one conductivity type. For each device a first region of the opposite conductivity type of predetermined area is formed at a surface of the substrate as by diffusing a material capable of imparting the opposite type of conductivity into a portion of the substrate. Next, an epitaxial layer of semiconductor material of the one conductivity type is deposited on the surface of the substrate and the exposed surface of the first region of the opposite conductivity type. A material capable of imparting the opposite type of conductivity is diffused into a plurality of portions of the epitaxial layer at the surface to form a plurality of second regions of the opposite conductivity type. Each second region extends through the layer to a first region of the opposite conductivity type. It encircles a first region of the epitaxial layer of the one conductivity type and is encircled by semiconductor material of the epitaxial layer of the one conductivity type. A material capable of imparting the opposite type of conductivity is diffused into a portion of each of the first regions of the epitaxial layer of the one conductivity type at the surface to form a plurality of graded regions of the opposite conductivity type with another portion of each of the first regions of the epitaxial layer of the one conductivity type lying intermediate a graded region and the zone of the opposite conductivity type constituted by a first region and a second region of the opposite conductivity type. Then, a material capable of imparting the one type of conductivity is diffused into a portion of each graded region of the opposite conductivity type at the surface to form a plurality of graded regions of the one conductivity type with another portion of each graded region of the opposite conductivity type lying intermediate a graded region of the one conductivity type and another portion of a first region of the epitaxial layer of the one conductivity type. Ohmic connections are then made to each of the second regions of the opposite conductivity type and to each of the graded regions of the one conductivity type at the surface. Ohmic gate connections may also be made to the other portion of each of the graded regions of the opposite conductivity type at the surface.

The graded regions referred to above are inherently formed by reason of the diffusion procedures employed. That is, by virtue of the fact that the diffusion is accomplished by the introduction of the conductivity type imparting materials at the exposed surface areas of the wafer, the concentration of the conductivity type imparting materials in the respective regions decreases with distance from the surface at which they are introduced.

Additional objects, features, and advantages of the invention will be apparent from the following detailed discussion and the accompanying drawings wherein:

FIGS. 1 through 7 are perspective views in section of a portion of a wafer of semiconductor material illustrating various stages in the fabrication of a monolithic integrated circuit network containing four-layer devices in accordance with the invention.

In the figures the various parts of the semiconductor elements are not drawn to scale. Certain dimensions are exaggerated in relation to other dimensions in order to present a clearer understanding of the invention.

In fabricating PNPN devices in a monolithic integrated circuit network in accordance with the invention as illustrated in FIGS. 1 through 7, a slice or substrate of single crystal high resistivity semiconductor material of one conductivity type is provided as a supporting structure. The substrate is usually a slice of relatively large surface area on which many circuit networks each including many devices are fabricated simultaneouly. However, for purposes of clarity the production of only a few devices in a portion of a circuit on a small section of a slice will be shown and described. In the following description silicon is employed as the semiconductor material, although the teachings are obviously applicable to other semiconductor materials. Also by way of example, the substrate slice is of N-type conductivity and each device fabricated has an NPNP form of structure.

Figure 2:
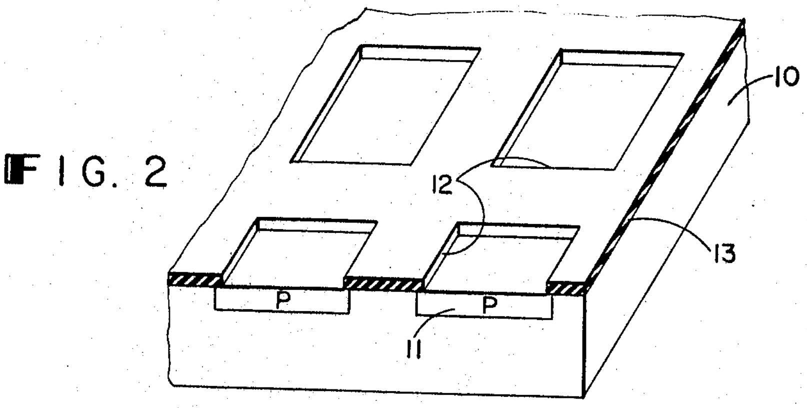

The slice or wafer 10 of high resistivity N-type silicon having flat, planar, parallel, opposed major surfaces as shown in FIG. 1 is produced by any of known techniques of crystal fabrication including appropriate slicing and cleaning operation. As illustrated in FIG. 2 a plurality of localized regions 11 of P-type material are formed in the surface of the substrate wafer by diffusion techniques. In order to diffuse a P-type conductivity imparting material only into the portions desired, known techniques of diffusing through an opening 12 is an adherent protective coating 13 are employed.

According to one well known technique an adherent, non-conductive protective coating of silicon oxide 13 is formed on the surface of the silicon wafer as by heating in a wet oxygen atmosphere. The oxide coating is covered with a photo-resist solution and the photo-resist is exposed to ultraviolet light through a mask shielding the areas delineating the openings through which the conductivity type imparting material is to be diffused. The photo-resist in these areas is thus not exposed to the light, and after the exposed portions are developed the unexposed resist on these areas is easily washed off while the exposed portions remain. The oxide coating unprotected by the resist is removed in an etching solution which does not attack the resist, thereby forming the openings 12 in the oxide coating 13. The previously exposed photo-resist is then dissolved to leave only the oxide coating with the openings of the desired configuration on the surface of the silicon wafer.

The wafer is treated in a diffusion furnace to diffuse a P-type conductivity imparting material through the openings 12 in the oxide into regions 11 of the N-type substrate 10 of predetermined area. Following the diffusion treatment the oxide coating is removed.

Figure 3:
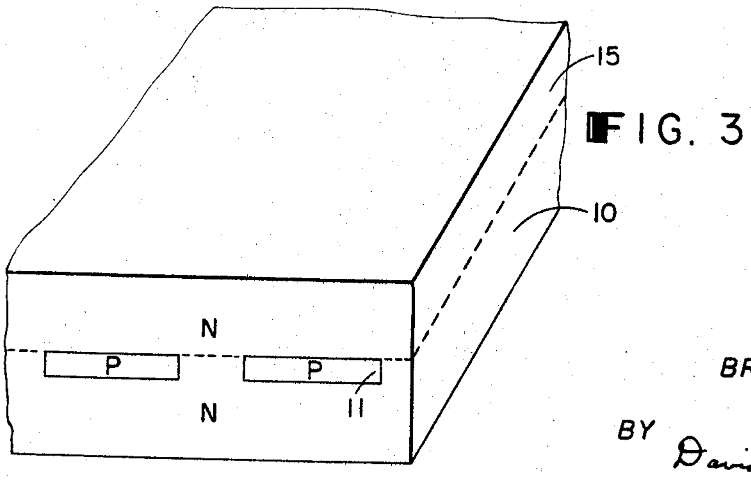

The substrate 10 is then placed in a suitable furnace apparatus, and as illustrated in FIG. 3 an epitaxial layer 15 of moderate resistivity N-type silicon is grown on the surface as by known vapor deposition techniques. A gaseous compound of silicon mixed with a controlled quantity of a gaseous compound of an N-type conductivity imparting material is reacted with hydrogen at the surface of the slice to cause deposition of silicon doped with the conductivity type imparting material. A layer 15 which is precisely controllable as to thickness and as to resistivity and which is a continuation of the crystalline structure of the single crystal silicon substrate 10 is thus deposited on the surface of the substate including the exposed surface P-type regions 11. The upper surface of the epitaxial layer is parallel to the interface the substrate and the layer.

Figure 4:
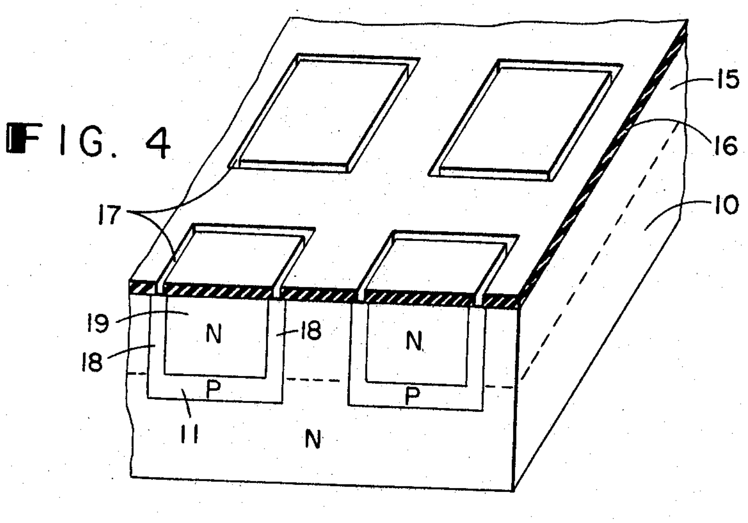

As shown in FIG. 4 a silicon oxide coating 16 is then formed on the surface of the epitaxial layer 15. Photo-resist masking and etching procedures are employed to produce openings 17 in the oxide coating. Each opening 17 in the oxide coating 16 encircles a portion of the coating and its outer perimeter approximately overlies the outer perimeter of one of the first P-type regions 11. The wafer is treated in a diffusion furnace to diffuse a P-type conductivity imparting material through each of the openings 17 in the oxide coating and into portions 18 of the N-type epitaxial layer. The diffusion treatment is maintained for a period of time sufficient to cause P-type conductivity imparting material to diffuse completely through the N-type epitaxial layer and convert to P-type conductivity regions 18 extending from the surface of the epitaxial layer to the first P-type diffused regions 11. A plurality of isolated N-type regions 19 each completely surrounded except at its surface area by P-type material of a first diffused region 11 and a second diffused region 18 are thereby obtained.

Figure 5:
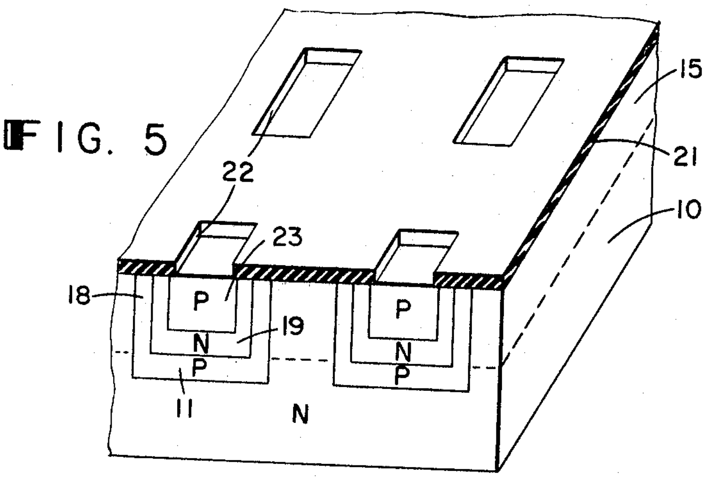

The silicon oxide coating is then reconstituted and the photo-resist masking and etching procedures repeated to produce a silicon oxide coating 21 having openings 22 exposing a portion of the surface area of each isolated N-type region 19 of the epitaxial layer 15 as shown in FIG. 5. A P-type conductivity imparting material is diffused through the openings to convert a portion 23 of each isolated N-type region 19 to P-type conductivity. A graded P-type region is thus otbained in which the resistivity increases with distance from the surface of the wafer.

Figure 6:
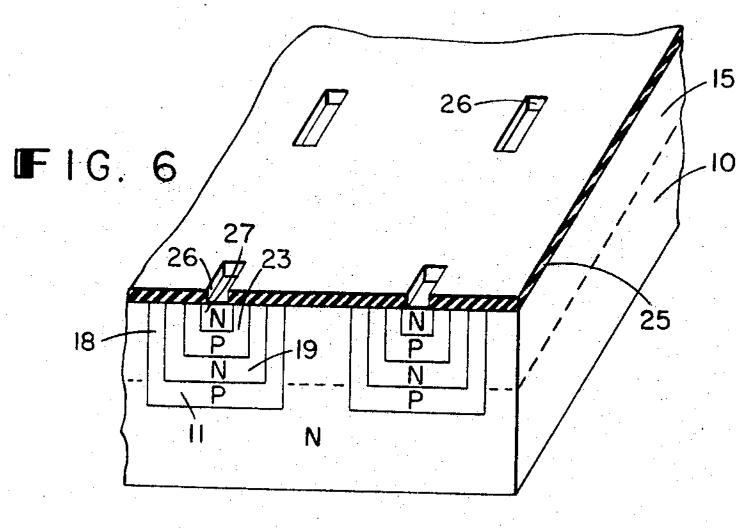

As illustrated in FIG. 6 the silicon oxide coating is again reconstituted and the photo-resist masking and etching procedures once again repeated to produce a silicon oxide coating 25 having smaller openings 26 exposing a portion of the surface area of each graded P-type region 23. An N-type conductivity imparting material is diffused through the openings to reconvert a portion 27 of each P-type diffused region to N-type conductivity. These N-type regions are also of graded resistivity with the heavier concentration of conductivity type imparting material adjacent the surfaces and the lesser concentration at the junction with the unreconverted P-type regions 23.

Figure 7:
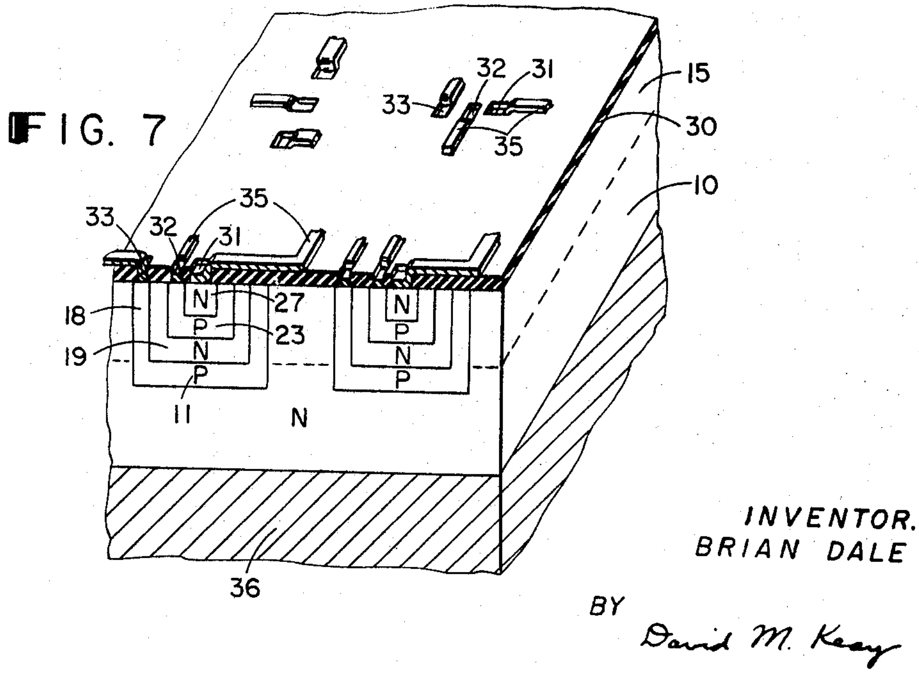

The surface of the wafer is further treated according to the above-mentioned masking and etching techniques to produce a protective oxide coating 30 having a plurality of openings therethrough as shown in FIG. 7. An opening is made to expose a portion of the surface area of each graded N-type region 27, each graded P-type region 23, and each second diffused P-type region 18. The portions of the surface areas of these regions exposed at the openings are metallized to produce ohmic contacts 31, 32, and 33, respectively, as by coating with a thin film of aluminum according to known vacuum deposition, masking, etching, and alloying techniques. At the same time portions of the surface of the oxide coating 30 are similarly metallized to provide interconnections 35. The interconections, only fragments of which are shown in FIG. 7, connect the four-layer devices and other devices to each other so as to form a complete circuit.

The underside of the wafer is etched to remove any portions of the substrate into which conductivity type imparting materials might have been diffused. Then the wafer is divided into several individual blocks each of which contains a complete monolithic integrated circuit network. Each block is monuted on a conductive member 36 with the lower surface of the N-type substrate 10 in ohmic contact with the member.

As can be seen from FIG. 7 each device has four active zones of alternating conductivity type set in an N-type bulk region which spaces the devices from each other. Each active zone and the bulk region has a surface area in the flat upper surface of the wafer, and the edge of each P-N junction at the surface is protected by overlying portions of the adherent non-conductive, oxide coating.

Electrical connection is made to appropriate active zones of each device by metal contacts 31, 32, and 33 at portions of the surface areas which are free of the oxide coating. As shown in FIG. 7 anode connections are made to the first diffused P-type regions 11 by way of the second diffused P-type regions 18, and cathode connections are made to the N-type double-diffused regions 27. A gate connection is also shown to each P-type graded region 23. However, devices according to the invention may be two terminal devices not employing a gate connection. The conductive member 36 in ohmic contact with the lower surface of the bulk region 10 of the body of silicon provides a contact for applying a relatively high positive voltage which reverse biases the P-N junctions between the bulk region and the P-type zones constituted by the first and second diffused P-type regions 11 and 18 of each device thereby electrically isolating the devices from each other.

By virtue of the resistivity profile and physical arrangement of the four active zones, four-layer devices according to the invention have desirable electrical characteristics. The advantageous switching action obtained in a device having a uniform epitaxially grown region into which two zones are formed by successive diffusion steps is discussed in application S.N. 244,075, filed Dec. 12, 1962, by Thomas A. Longo and Marvin Miller entitled Semiconductor Switching Device and Method of Manufacture, now Patent No. 3,312,880, and assigned to the assignee of the present invention. Thus, devices according to the invention provide desirable electrical characteristics and also fulfill other requirements which render them satisfactory for incorporation into monolithic integrated circuit networks.

In the fabrication of a typical integrated circuit network incorporatiing four-layer devices of the invention the starting material or substrate 10 was a slice of single crystal N-type silicon lightly doped with arsenic to produce a resistivity of approximately 10 ohm-centimeters. The slice was approximately 7 mils thick. The first P-type regions 11 were formed by diffusing boron through openings 12 3 mils by 6 mils in the oxide coating.

A single crystal epitaxial layer 15 of N-type silicon doped with arsenic was grown on the slice. The layer was approximately 5 microns thick and of about .4 ohm-centimeter resistivity.

Following the epitaxial deposition process the second P-type region 18 of each device was formed by diffusing boron through openings 17 in the oxide coating. Each opening was in the shape of a rectangular frame having outer dimensions approximately 3 mils by 6 mils and a frame width of about ½ mil. The outer perimeter of the openings overlaid the outer perimeter of the first P-type regions 11 and the second diffused P-type regions extended through the epitaxial layer to the first P-type regions.

Next, a P-type graded region 23 and an N-type graded region 27 were successively diffused into each isolated N-type region 19 of the epitaxial layer. Boron was diffused through openings 22 in the oxide coating having the dimensions 1½ mils by 2 mils. Phosphorus was then diffused through 1 mil by 1 mil openings 26 in the reconstituted oxide coating to produce an N-type region 27 centrally of each P-type diffused region 23. The double diffusion into the N-type region provided diffused P-type regions 23 about 1 micron thick and double diffused N-type regions 27 about 1 micron thick. The final thickness of the N-type regions 19 of the epitaxial layer was approximately 1½ microns, some of the lowermost portion of the layer having been converted to P-type conductivity by upward diffusion from the first P-type diffused regions during processing steps subsequent to the first P-type diffusion.

Aluminum contacts 31, 32, and 33 and interconnections 35 were then vacuum deposited on exposed areas at the surface and on the surface of the oxide coating. The underside of the wafer was etched sufficiently to remove any conductivity type imparting materials which might have diffused into the substrate at the lower surface. The wafer was then broken into individual blocks each containing a complete circuit network, and each block was mounted with the N-type substrate in ohmic contact with a conductive member.

What is claimed is:

1. A monolithic integrated circuit network comprising
a body of semiconductor material having opposed flat parallel major surfaces and including
a region of one conductivity type,
a plurality of devices spaced apart by portions of said region,
each of said devices having four zones of alternating conductivity type,
the first zone of each device being of the one conductivity type of graded resistivity and having a surface area in one of said major surfaces of the body,
the second zone of each device being of the opposite conductivity type of graded resistivity contiguous all portions of the periphery of the first zone except at said surface and having a surface area in said surface of the body encircling the surface area of the first zone, the second zone of each device forming a PN junction with the contiguous first zone,
the third zone of each device being of the one conductivity type of uniform moderate resistivity contiguous all portions of the periphery of the second zone except the portions contiguous the first zone and at the surface and having a surface area in said one surface of the body encircling the surface area of the second zone, the third zone of each device forming a PN junction with the contiguous second zone,
the fourth zone of each device being of the opposite conductivity type of graded resistivity contiguous all portions of the periphery of the third zone except the portions contiguous the second zone and at the surface and having a surface area in said one surface of the body encircling the surface area of the third zone, the fourth zone of each device forming a PN junction with the contiguous third zone,
said region of the one conductivity type being contiguous all portions of the periphery of each of the fourth zones except the portions contiguous the second zones and at the surface and having a surface area in said surface of the body encircling the surface areas of each of the fourth zones and having a surface constituting the other of said major surfaces of the body, said region forming a PN junction with each of said fourth zones,
a coating of an adherent non-conductive material on said one surface of the body overlying the edges of the P-N junctions between each of the first and second zones, each of the second and third zones, each of the third and fourth zones, and each of the fourth zones and said region,
a plurality of first openings in said coating, each opening delineating a portion of the surface area of a first zone free of non-conductive material,
a layer of conductive material on each of said portions of the surface areas of the first zones in ohmic contact with the semiconductor material of the first zones,
a plurality of second openings in said coating, each opening delineating a portion of the surface area of a fourth zone free of non-conductive material,
a layer of conductive material on each of said portions of the surface areas of the fourth zones in ohmic contact with the semiconductor material of the fourth zones, and an ohmic connection to said region at the other of said major surfaces of the body.

References Cited

UNITED STATES PATENTS

| | | | |
|---|---|---|---|
| 3,309,537 | 3/1967 | Archer | 307—88.5 |
| 3,197,710 | 7/1965 | Lin | 330—38 |
| 3,210,677 | 10/1965 | Lin et al. | 330—17 |
| 3,278,853 | 10/1966 | Lin | 330—24 |
| 3,293,087 | 12/1966 | Porter | 148—175 |

JOHN W. HUCKERT, *Primary Examiner.*

R. SANDLER, *Assistant Examiner.*

U.S. Cl. X.R.

148—175, 187, 189